US011848046B2

(12) United States Patent
Hu

(10) Patent No.: US 11,848,046 B2
(45) Date of Patent: Dec. 19, 2023

(54) SENSE AMPLIFIER AND OPERATION METHOD THEREOF

(71) Applicant: MACRONIX INTERNATIONAL CO., LTD., Hsinchu (TW)

(72) Inventor: Han-Wen Hu, Tainan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 121 days.

(21) Appl. No.: 17/694,771

(22) Filed: Mar. 15, 2022

(65) Prior Publication Data

US 2023/0298660 A1 Sep. 21, 2023

(51) Int. Cl.

*G11C 16/16* (2006.01)
*G11C 11/4091* (2006.01)
*G11C 11/4096* (2006.01)
*G11C 11/4074* (2006.01)
*G11C 11/4099* (2006.01)

(52) U.S. Cl.

CPC ...... *G11C 11/4091* (2013.01); *G11C 11/4074* (2013.01); *G11C 11/4096* (2013.01); *G11C 11/4099* (2013.01)

(58) Field of Classification Search

CPC ............ G11C 11/4091; G11C 11/4074; G11C 11/4096; G11C 11/4099

See application file for complete search history.

(56) References Cited

U.S. PATENT DOCUMENTS 6,868,025 B2 3/2005 Hsu
11,404,110 B2 * 8/2022 Kadowaki .......... G11C 11/4094
2007/0024325 A1 2/2007 Chen

FOREIGN PATENT DOCUMENTS

TW 200425161 A 11/2004
TW 200537105 A 11/2005
TW 200707451 A 2/2007

* cited by examiner

*Primary Examiner* — Xiaochun L Chen
(74) *Attorney, Agent, or Firm* — McClure, Qualey & Rodack, LLP

(57) ABSTRACT

The application provides a sense amplifier and an operation method thereof. The operation method for the sense amplifier includes: during a first phase, initializing a first sensing input voltage and a second input sensing voltage; and recording a first sensing output voltage and a second sensing output voltage of a previous round by charges stored in a plurality of transistors of the sense amplifier; during a second phase, sampling the first sensing output voltage and the second sensing output voltage of a current round as a plurality of transit points; during a first sub-phase of a third phase, amplifying a voltage difference between an input signal and a first reference voltage; and during a second sub-phase of the third phase, pulling the first sensing output voltage and the second sensing output voltage into a full-swing voltage range, and recording charges to the transistors of the sense amplifier.

16 Claims, 13 Drawing Sheets

Start

710
During a first phase, initializing a first sensing input voltage and a second input sensing voltage, and recording a first sensing output voltage and a second sensing output voltage of a previous round by charges stored in a plurality of transistors of the sense amplifier 720
During a second phase, sampling the first sensing output voltage and the second sensing output voltage of a current round as a plurality of transit points 730
During a first sub-phase of a third phase, amplifying a voltage difference between an input signal and a first reference voltage 740
During a second sub-phase of the third phase, pulling the first sensing output voltage and the second sensing output voltage into a full-swing voltage range, and recording charges to the transistors of the sense amplifier End

SENSE AMPLIFIER AND OPERATION METHOD THEREOF

TECHNICAL FIELD

The disclosure relates in general to a sense amplifier and an operation method thereof.

BACKGROUND

The non-volatile memory suffers from a decreased read margin with shrinking in device size and the operation voltage but keeping the same threshold voltage.

The sensing margin required by the non-volatile memory is dominated by the sense amplifier offset and the bit line level offsets. The sense amplifier offset is caused by device mismatch resulted from process variations. The bit line level offset is the result of noise, bias and load mismatches between the bit lines. With reduced sized, how to overcome these issues has become a major challenge in the read operations of the non-volatile memory with a smaller read margin.

Due to these offsets, the non-volatile memory suffers from slow read speed or high fail probability. Thus, developing sense amplifiers having larger offset tolerance is a prerequisite to achieving high-yield emerging non-volatile memories with robust read operations.

SUMMARY

According to one embodiment, provided is an operation method for a sense amplifier, the operation method comprising: during a first phase, initializing a first sensing input voltage and a second input sensing voltage; and recording a first sensing output voltage and a second sensing output voltage of a previous round by charges stored in a plurality of transistors of the sense amplifier; during a second phase, sampling the first sensing output voltage and the second sensing output voltage of a current round as a plurality of transit points; during a first sub-phase of a third phase, amplifying a voltage difference between an input signal and a first reference voltage; and during a second sub-phase of the third phase, pulling the first sensing output voltage and the second sensing output voltage into a full-swing voltage range, and recording charges to the transistors of the sense amplifier.

According to another embodiment, provided is a sense amplifier comprising: a plurality of transistors; and a plurality of pass gates coupled to the transistors, wherein during a first phase, initializing a first sensing input voltage and a second input sensing voltage; and recording a first sensing output voltage and a second sensing output voltage of a previous round by charges stored in the transistors; during a second phase, sampling the first sensing output voltage and the second sensing output voltage of a current round as a plurality of transit points; during a first sub-phase of a third phase, amplifying a voltage difference between an input signal and a first reference voltage; and during a second sub-phase of the third phase, pulling the first sensing output voltage and the second sensing output voltage into a full-swing voltage range, and recording charges to the transistors of the sense amplifier.

Figure 1A:
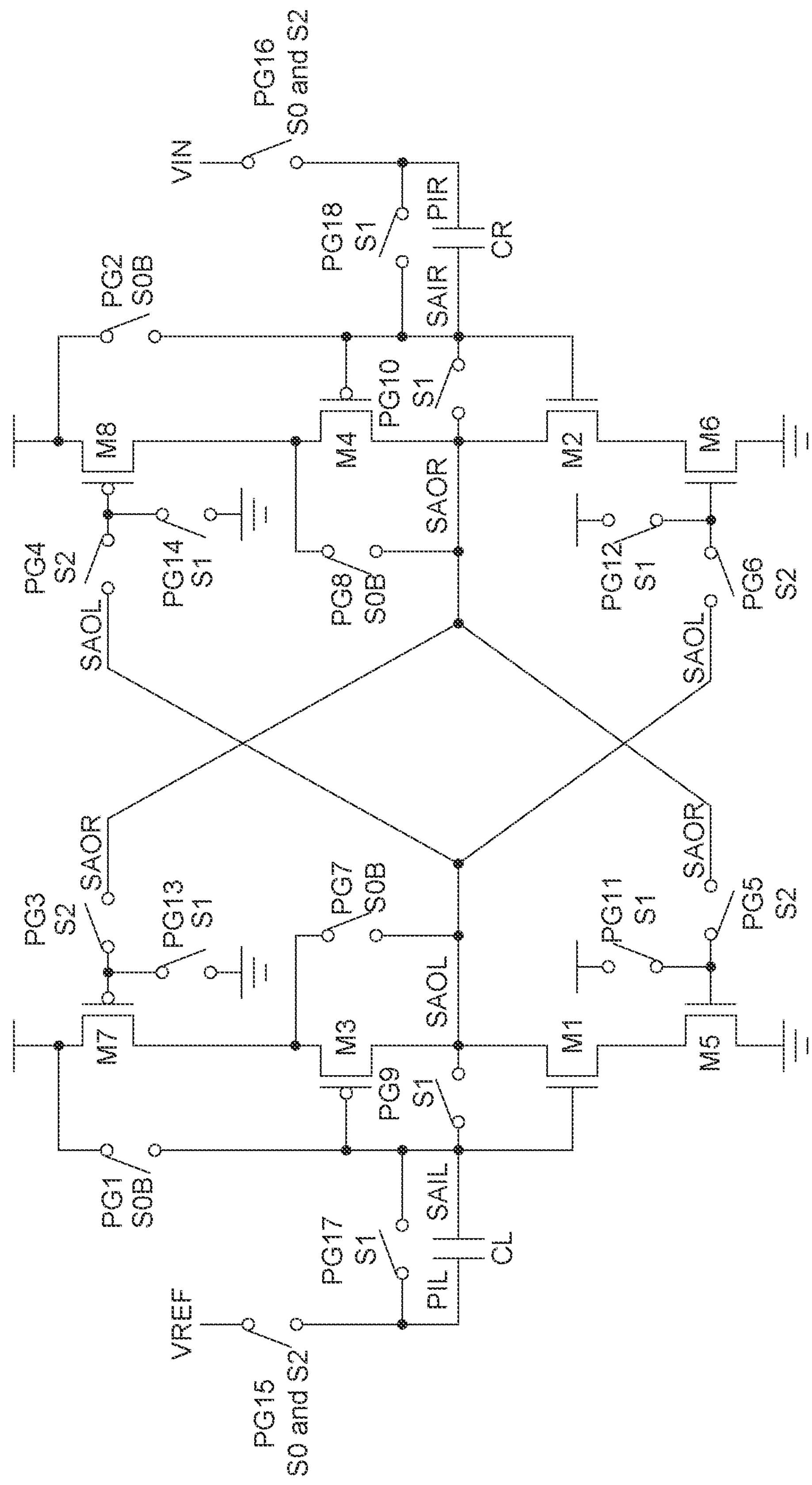
FIG. 1A shows a circuit diagram of a sense amplifier according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 1B:
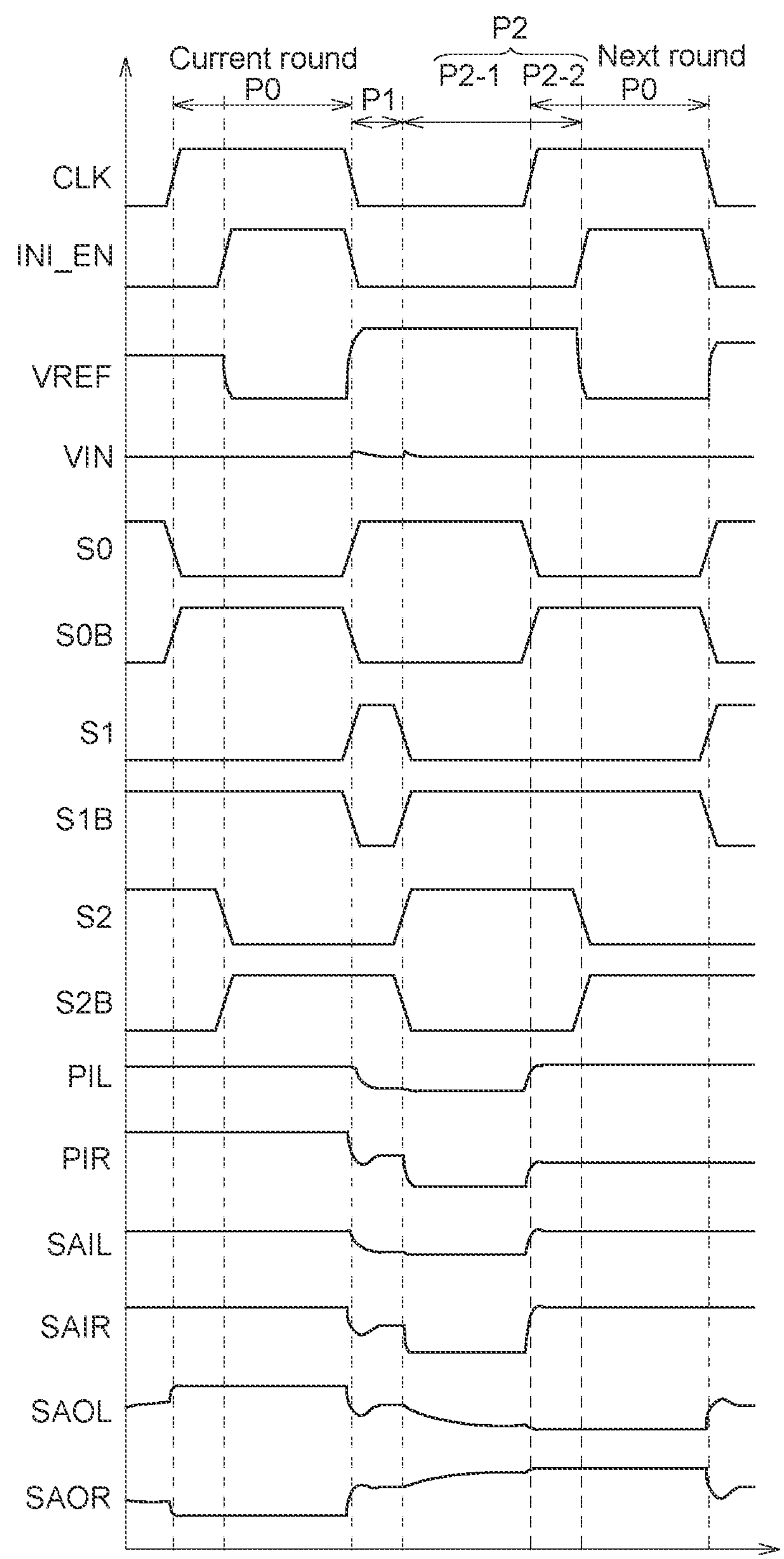
FIG. 1B shows a signal waveform diagram of the sense amplifier according to one embodiment of the application, wherein "CLK" refers to a clock signal.

FIG. 1A shows a circuit diagram of a sense amplifier according to one embodiment of the application. FIG. 1B shows a signal waveform diagram of the sense amplifier according to one embodiment of the application, wherein "CLK" refers to a clock signal.

The sense amplifier 100 is for comparing an input signal IN with a first reference voltage VREF to generate a comparison result. For example but not limited by, when the input signal IN is higher than the first reference voltage VREF, the sense amplifier 100 generates a first sensing output voltage SAOL having a first logic state (for example but not limited by logic low) and a second sensing output voltage SAOR having a second logic state (for example but not limited by logic high); and when the input signal IN is lower than the first reference voltage VREF, the sense amplifier 100 generates the first sensing output voltage SAOL having the second logic state and the second sensing output voltage SAOR having the first logic state. The operation details of the sense amplifier 100 are described.

The sense amplifier 100 according to one embodiment of the application includes a plurality of transistors, a plurality of pass gates and a plurality of capacitors. Here, the sense amplifier 100 includes first to eighth transistors M1-M8, first to eighteenth pass gates PG1-PG18 and first to second capacitors CL and CR, but the application is not limited by this.

The first transistor M1 includes a first terminal (for example but not limited by a source terminal) coupled to the fifth transistor M5; a second terminal (for example but not limited by a drain terminal) coupled to the first sensing output voltage SAOL; and a control terminal (for example but not limited by a gate terminal) coupled to the first sensing input voltage SAIL.

The second transistor M2 includes a first terminal coupled to the sixth transistor M6; a second terminal coupled to the second sensing output voltage SAOR; and a control terminal coupled to the second sensing input voltage SAIR.

The third transistor M3 includes a first terminal coupled to the seventh transistor M7; a second terminal coupled to the first sensing output voltage SAOL; and a control terminal coupled to the first sensing input voltage SAIL.

The fourth transistor M4 includes a first terminal coupled to the eighth transistor M8; a second terminal coupled to the second sensing output voltage SAOR; and a control terminal coupled to the second sensing input voltage SAIR.

The fifth transistor M5 includes a first terminal coupled to the ground terminal VSS; a second terminal coupled to the first transistor M1; and a control terminal selectively coupled to the second sensing output voltage SAOR and selectively coupled to an operation voltage VDD.

The sixth transistor M6 includes a first terminal coupled to the ground terminal VSS; a second terminal coupled to the second transistor M2; and a control terminal selectively coupled to the first sensing output voltage SAOL and selectively coupled to the operation voltage VDD.

The seventh transistor M7 includes a first terminal coupled to the operation voltage VDD; a second terminal coupled to the third transistor M3; and a control terminal selectively coupled to the second sensing output voltage SAOR and selectively coupled to the ground terminal VSS.

The eighth transistor M8 includes a first terminal coupled to the operation voltage VDD; a second terminal coupled to the fourth transistor M4; and a control terminal selectively coupled to the first sensing output voltage SAOL and selectively coupled to the ground terminal VSS.

The operation voltage VDD is also referred as a second reference voltage and the ground terminal VSS is also referred as a third reference voltage.

The first pass gate PG1 is coupled between the operation voltage VDD and the first sensing input voltage SAIL. The first pass gate PG1 is controlled by an inverted signal S0B of a first switch signal S0.

The second pass gate PG2 is coupled between the operation voltage VDD and the second sensing input voltage SAIR. The second pass gate PG2 is controlled by the inverted signal S0B of the first switch signal S0.

The third pass gate PG3 is coupled between the control terminal of the seventh transistor M7 and the second sensing output voltage SAOR. The third pass gate PG3 is controlled by a third switch signal S2.

The fourth pass gate PG4 is coupled between the control terminal of the eighth transistor M8 and the first sensing output voltage SAOL. The fourth pass gate PG4 is controlled by the third switch signal S2.

The fifth pass gate PG5 is coupled between the control terminal of the fifth transistor M5 and the second sensing output voltage SAOR. The fifth pass gate PG5 is controlled by the third switch signal S2.

The sixth pass gate PG6 is coupled between the control terminal of the sixth transistor M6 and the first sensing output voltage SAOL. The sixth pass gate PG6 is controlled by the third switch signal S2.

The seventh pass gate PG7 is coupled between the control terminal of the third transistor M3 and the first sensing output voltage SAOL. The seventh pass gate PG7 is controlled by the inverted signal S0B of the first switch signal S0.

The eighth pass gate PG8 is coupled between the first terminal of the fourth transistor M4 and the second sensing output voltage SAOR. The eighth pass gate PG8 is controlled by the inverted signal S0B of the first switch signal S0.

The ninth pass gate PG9 is coupled between the first sensing input voltage SAIL and the first sensing output voltage SAOL. The ninth pass gate PG9 is controlled by the second switch signal S1.

The tenth pass gate PG10 is coupled between the second sensing input voltage SAIR and the second sensing output voltage SAOR. The tenth pass gate PG10 is controlled by the second switch signal S1.

The eleventh pass gate PG11 is coupled between the operation voltage VDD and the control terminal of the fifth transistor M5. The eleventh pass gate PG11 is controlled by the second switch signal S1.

The twelfth pass gate PG12 is coupled between the operation voltage VDD and the control terminal of the sixth transistor M6. The twelfth pass gate PG12 is controlled by the second switch signal S1.

The thirteenth pass gate PG13 is coupled between the ground VSS and the control terminal of the seventh transistor M7. The thirteenth pass gate PG13 is controlled by the second switch signal S1.

The fourteenth pass gate PG14 is coupled between the ground VSS and the control terminal of the eighth transistor M8. The fourteenth pass gate PG14 is controlled by the second switch signal S1.

The fifteenth pass gate PG15 is coupled between the reference voltage VREF and the first capacitor CL. The fifteenth pass gate PG15 is controlled by the first switch signal S0 and the third switch signal S2.

The sixteenth pass gate PG16 is coupled between the input signal IN and the second capacitor CR. The sixteenth pass gate PG16 is controlled by the first switch signal S0 and the third switch signal S2.

The seventeenth pass gate PG17 is coupled between the control terminal of the first transistor M1 and the first capacitor CL. The seventeenth pass gate PG17 is controlled by the second switch signal S1.

The eighteenth pass gate PG18 is coupled between the control terminal of the second transistor M2 and the second capacitor CR. The eighteenth pass gate PG18 is controlled by the second switch signal S1.

Each of the first to the eighteenth pass gates PG1-PG18 may be implemented by a single Metal-Oxide-Semiconductor Field-Effect Transistor (MOSFET) or two MOSFETs, which is still within the spirit and the scope of the application.

The first capacitor CL is coupled between the first node PIL and the first sensing output voltage SAOL. The second capacitor CR is coupled between the second node PIR and the second sensing output voltage SAOR.

In one embodiment of the application, during a single round, operations of the sense amplifier 100 may include a first phase P0, a second phase P1 and a third phase P2, wherein the third phase P2 includes a first sub-phase P2-1 and a second sub-phase P2-2.

Figure 2A:
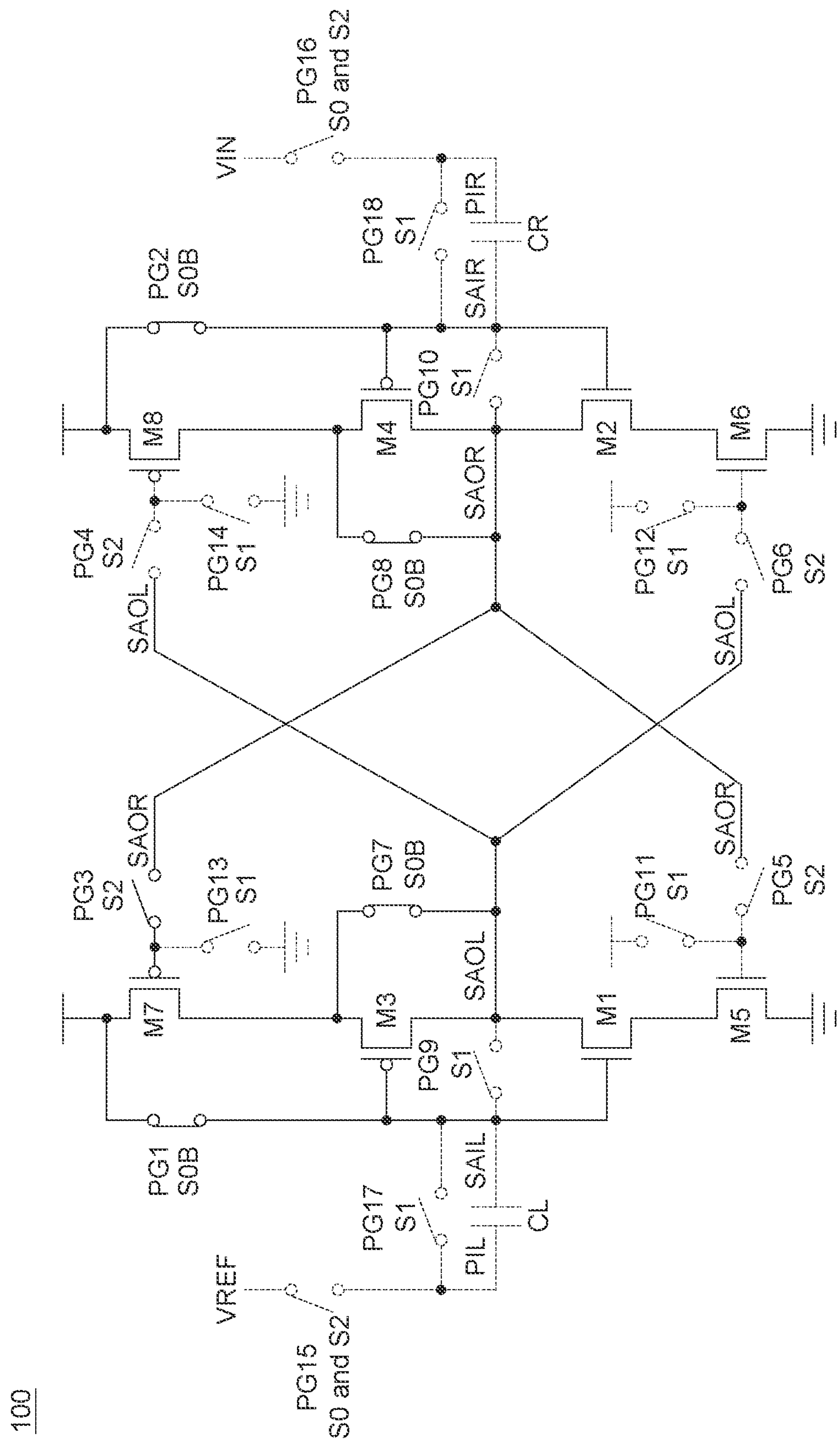
FIG. 2A shows operations of the sense amplifier in the first phase according to one embodiment of the application.
Figure 2B:
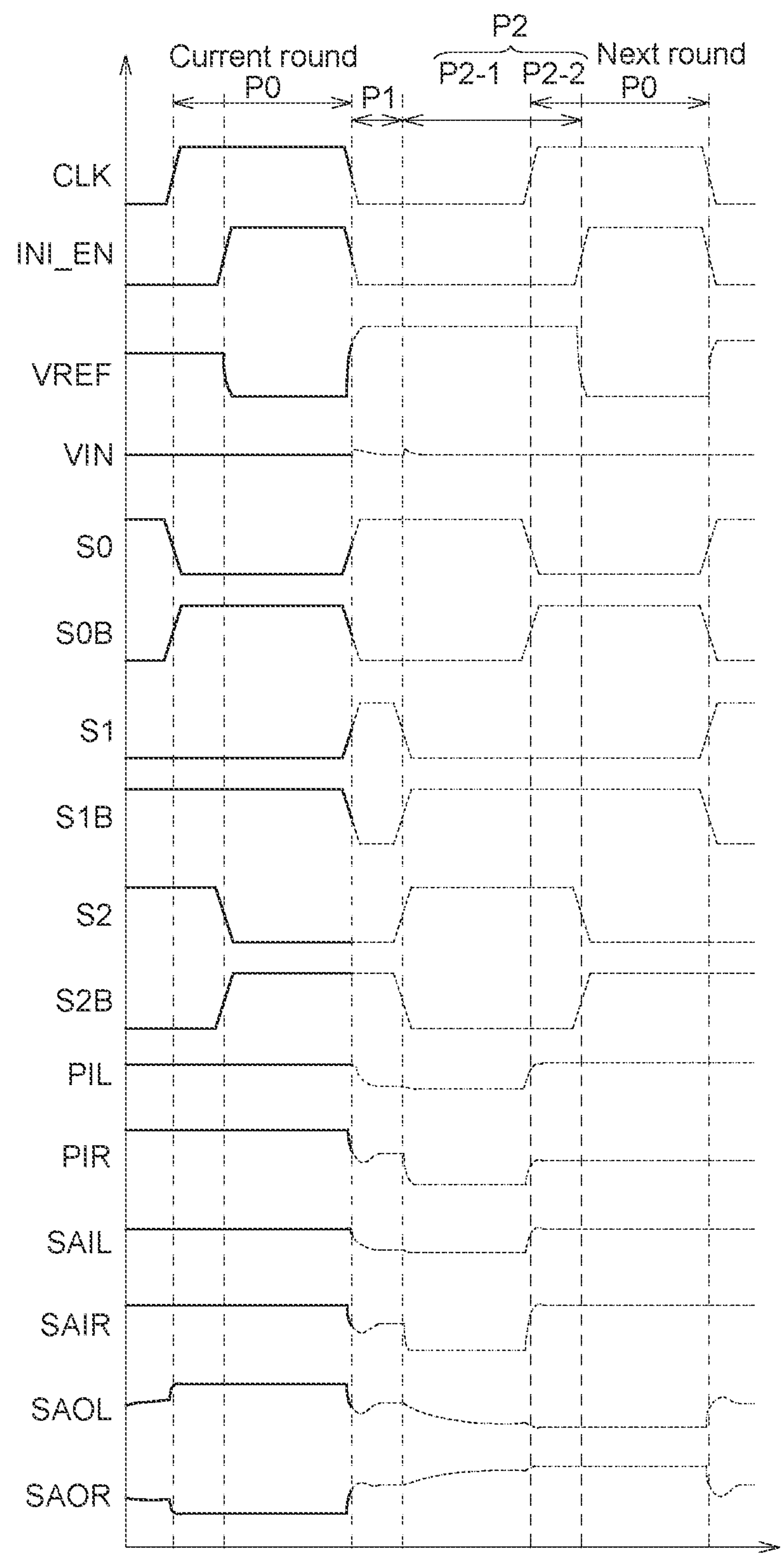
FIG. 2B shows waveforms of the sense amplifier in the first phase according to one embodiment of the application.

FIG. 2A shows operations of the sense amplifier in the first phase according to one embodiment of the application. FIG. 2B shows waveforms of the sense amplifier in the first phase according to one embodiment of the application.

When the enable signal INI_EN is enabled (for example but not limited by, from logic low to logic high), the sense amplifier 100 begins signal sensing. After the enable signal INI_EN is enabled, the switch signals S0 and S1 keep logic low (but the inverted signal S0B of the first switch signal S0 is logic high) but the switch signal S2 transits from logic high to logic low. In response that the inverted signal S0B of the first switch signal S0 is logic high, the pass gates PG1, PG2, PG7 and PG8 are connected while the other pass gates are disconnected. Because the pass gates PG1 and PG2 are connected, the first sensing input voltage SAIL and the second sensing input voltage SAIR are the same as the operation voltage VDD (VSAIL=VSAIR=VDD).

During the first phase P0, because the first sensing input voltage SAIL and the second sensing input voltage SAIR are the same as the operation voltage VDD, the transistors M1 and M2 are conducted but the transistors M3 and M4 are turned off. Further, the transistors M5 to M8 are also turned off.

Further, during the first phase PC, the first sensing output voltage SAOL and the second sensing output voltage SAOR of the previous round are recorded by using charges stored in the gates of the fifth transistor M5 to the eighth transistor M8. Here, “recording” refers to keep the first sensing output voltage SAOL and the second sensing output voltage SAOR of the previous round.

During the first phase P0, the input voltage IN keeps logic high while the reference voltage VREF is transited (for example but not limited by, from logic high to logic low).

During the first phase P0, because the pass gates PG15 and PG16 are disconnected, levels of the first node PIL and the second node PIR are not changed. Because the levels of the first node PIL and the second node PIR are not changed, the first sensing input voltage SAIL and the second sensing input voltage SAIR are not changed, and the first sensing output voltage SAOL and the second sensing output voltage SAOR are not changed.

During the first phase P0, the first sensing input voltage SAIL and the second sensing input voltage SAIR are initialized (VSAIL=VSAIR=VDD); and the first sensing output voltage SAOL and the second sensing output voltage SAOR of the previous round are recorded by using charges stored in the gates of the fifth transistor M5 to the eighth transistor M8.

Figure 3A:
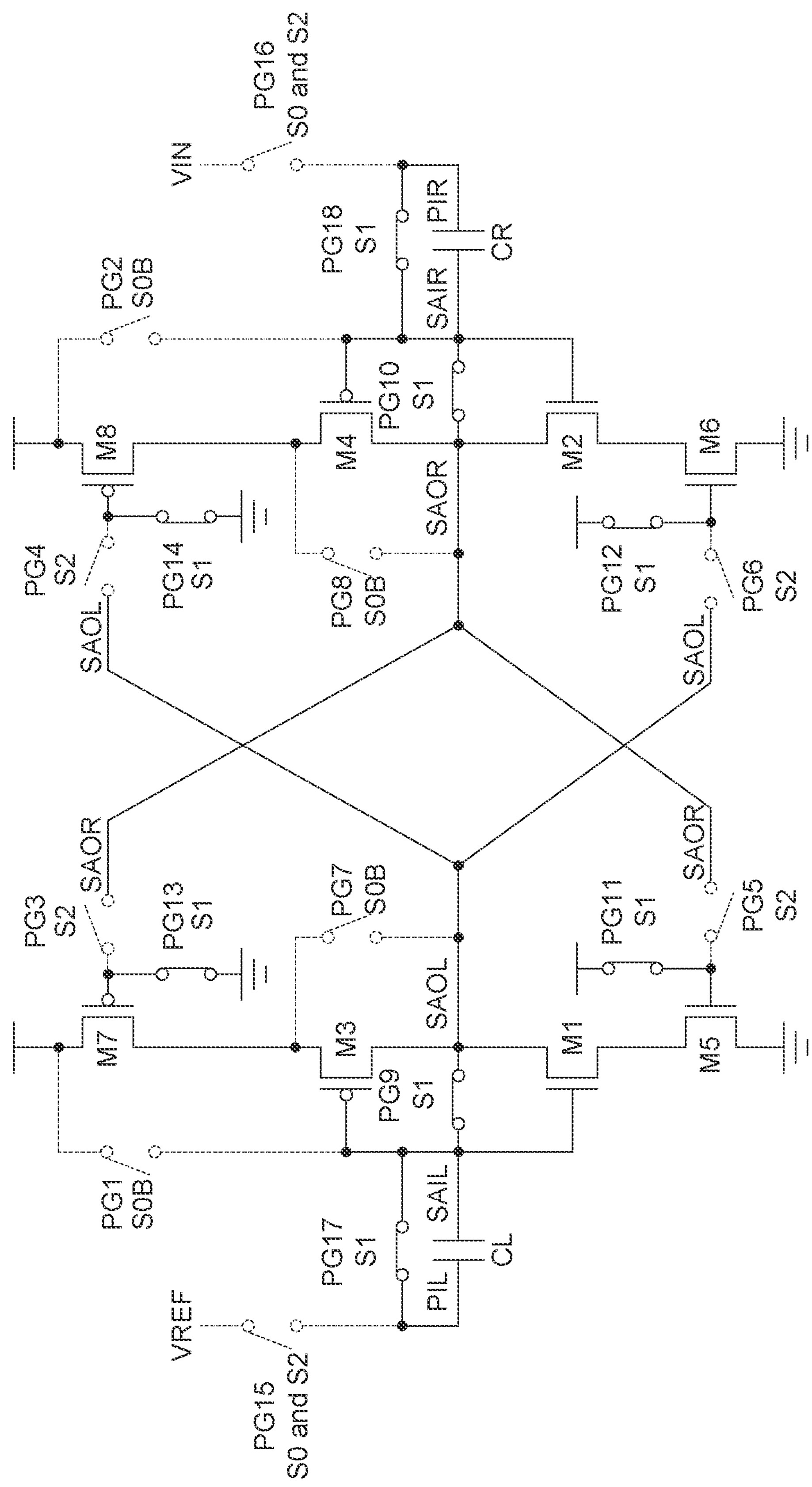
FIG. 3A shows operations of the sense amplifier in the second phase according to one embodiment of the application.
Figure 3B:
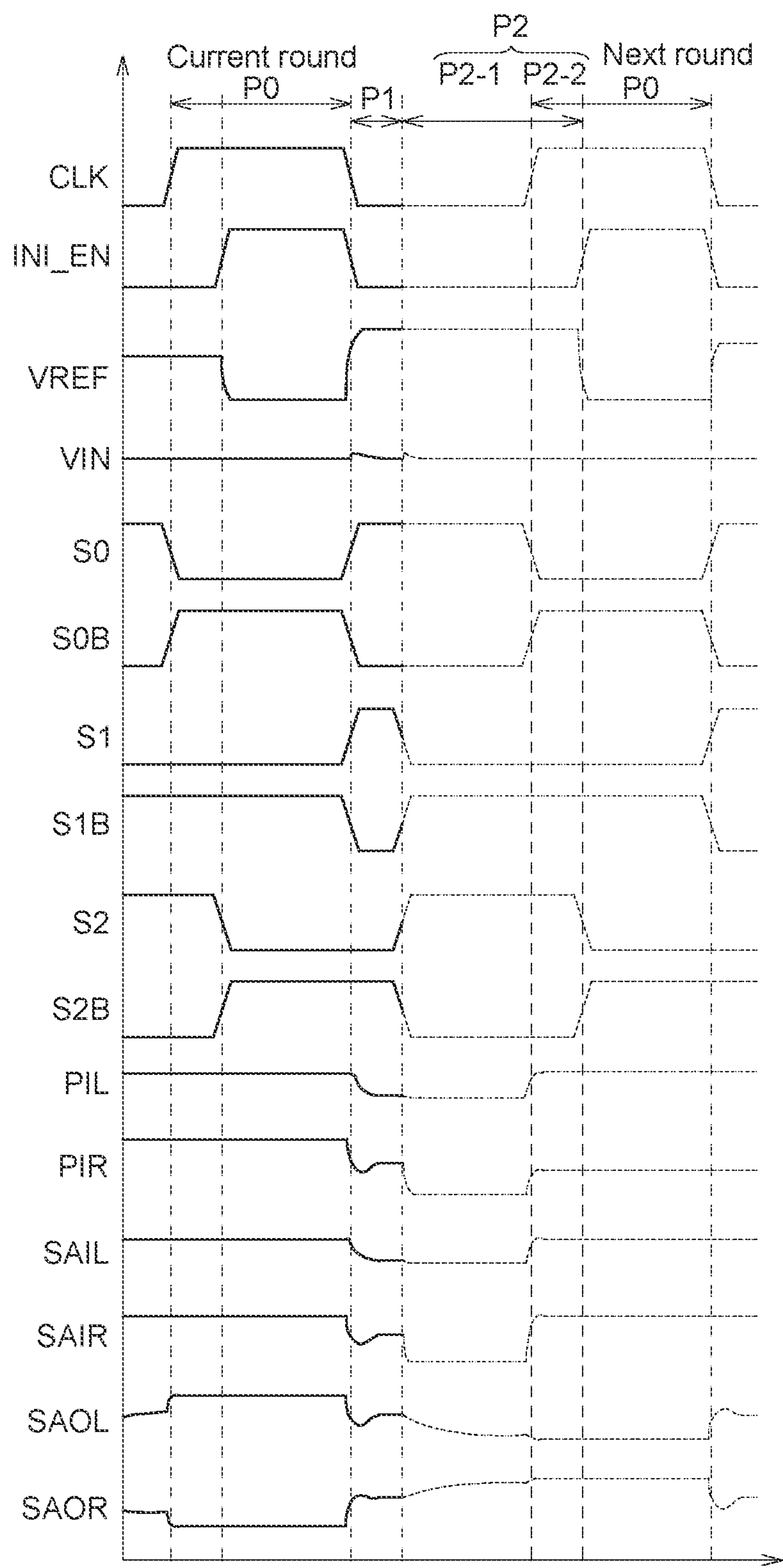
FIG. 3B shows waveforms of the sense amplifier in the second phase according to one embodiment of the application.

FIG. 3A shows operations of the sense amplifier in the second phase according to one embodiment of the application. FIG. 3B shows waveforms of the sense amplifier in the second phase according to one embodiment of the application.

During the second phase P1, the transit points (Vtri-point) are sampled. That is, during the second phase P1, respective transit points of the two signal paths are sampled (one signal path including the transistors M1, M3, M5 and M7 while the other signal path including the transistors M2, M4, M6 and M8).

The transit points (Vtri-point) are explained.

As shown in FIG. 1A, the transistors M1 and M3 are considered as forming an inverter. Assuming that the source terminal of the transistor M3 is coupled to the operation voltage VDD and the source terminal of the transistor M1 is coupled to the ground VSS. When the first sensing input voltage SAIL is logic 1, then the first sensing output voltage SAOL is logic 0. Vice versa.

During the first sensing input voltage SAIL is transited from logic 1 to logic 0, when the first sensing input voltage SAIL is logic 1 is lowered from the logic 1 to (½)*VDD, the first sensing output voltage SAOL is immediately transited from logic 0 to logic 1. Thus, in one embodiment of the application, the input voltage which makes the transient transition of the output voltage is referred as the transit points.

But when there are process variations, the transient transit point of the first sensing output voltage SAOL is not as the first sensing input voltage SAIL lowered to (½)*VDD. That is, when the first sensing input voltage SAIL is not lowered to (½)*VDD yet (i.e. VSAIL=(½)*VDD+Δ, Δ being a positive voltage), the first sensing output voltage SAOL is transiently transited. Or, after the first sensing input voltage SAIL is lowered to be lower than (½)*VDD (i.e. VSAIL=(½)*VDD-Δ), the first sensing output voltage SAOL is transiently transited. Thus, the transient transit point of the first sensing output voltage SAOL may have higher or lower variation (Δ), which may cause error reading.

Thus, in one embodiment of the application, in order to prevent the error reading, during the second phase P1, the transit points (Vtri-point) are sampled and details are described as below.

During the second phase P1, the first switch signal S0 and the second switch signal S1 are transited from logic low to logic high; and the third switch signal S2 still keeps logic low.

Thus, the pass gates PG9, PG11, PG13, PG17, PG10, PG12, PG14 and PG18 are connected while the other pass gates are disconnected.

Further, in the previous phase (i.e. the first phase P0), because the first sensing input voltage SAIL, the first node PIL, the second sensing input voltage SAIR and the second node PIR are also at the operation voltage VDD, the transistors M1 and M2 are connected but the transistors M3 and M4 are turned off.

Because the pass gates PG11 and PG12 are connected, the operation voltage VDD is conducted to the gates of the transistors M5 and M6 to conduct the transistors M5 and M6.

Further, because the pass gates PG13 and PG14 are connected, the ground VSS is conducted to the gates of the transistors M7 and M8 to conduct the transistors M7 and M8.

Via the conducted pass gates, the first sensing output voltage SAOL and the second sensing output voltage SAOR are sampled as the transient transit points stored in the first capacitor CL and the second capacitor CR, wherein the transient transit point stored in the first capacitor CL is the same as the threshold voltages of the transistors M7, M3, M1 and M5, while the transient transit point stored in the second capacitor CR is the same as the threshold voltages of the transistors M8, M4, M2 and M6. That is, the first sensing output voltage SAOL has a voltage VSAOL=VTPL while the second sensing output voltage SAOR has a voltage VSAOR=VTPR, wherein VTPL is the transient transit point of the signal path M7M3M1M5 (i.e. the threshold voltages of the transistors M7, M3, M1 and M5) and VTPR is the transient transit point of the signal path M8M4M2M6 (i.e. the threshold voltages of the transistors M8, M4, M2 and MG). Similarly, VPIL=VSAIL=VSAOL=VTPL and VPIR=VSAIR=VSAOR=VTPR.

Figure 4A:
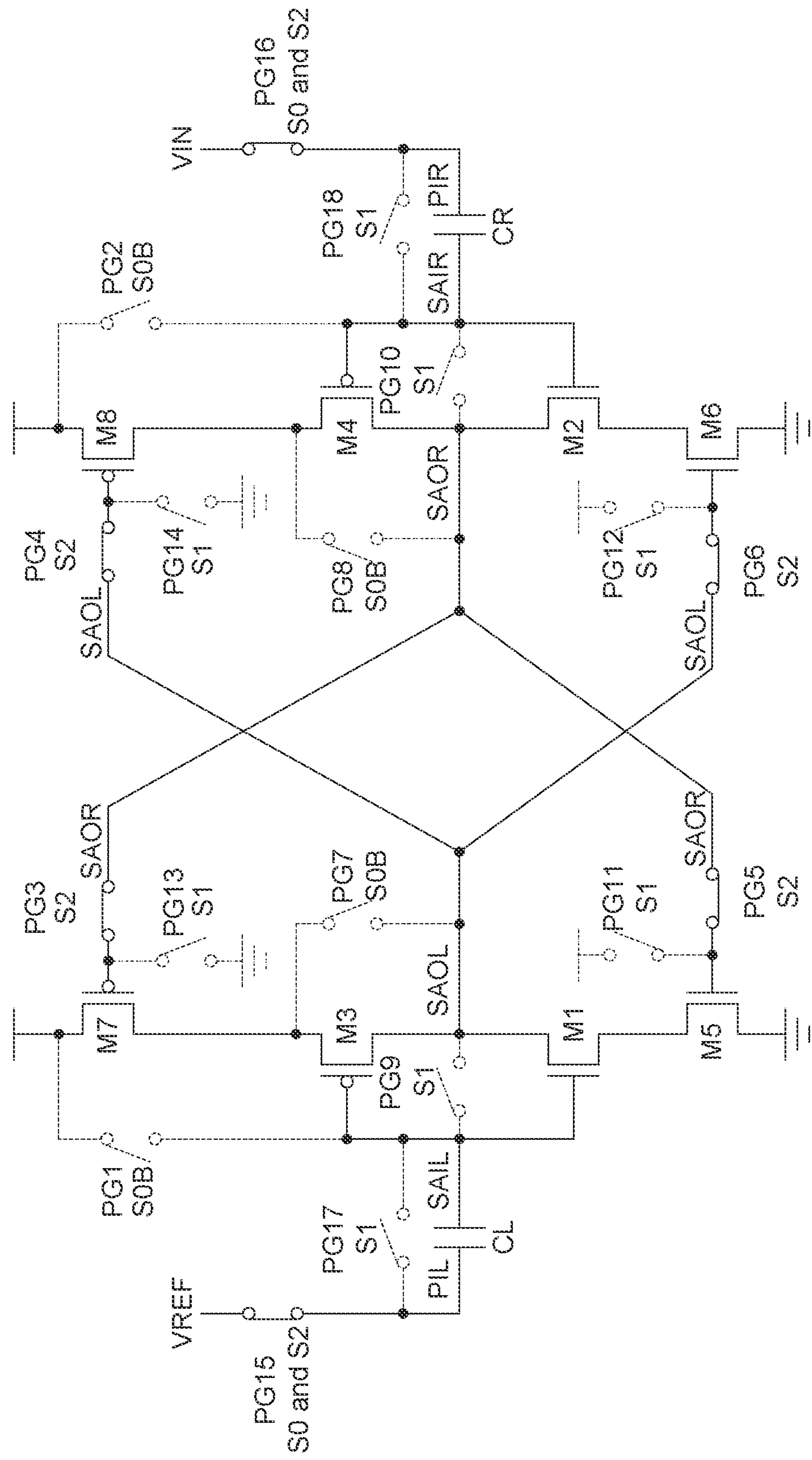
FIG. 4A shows operations of the sense amplifier in the first sub-phase of the third phase according to one embodiment of the application.

FIG. 4A shows operations of the sense amplifier in the first sub-phase of the third phase according to one embodiment of the application.

Figure 4B:
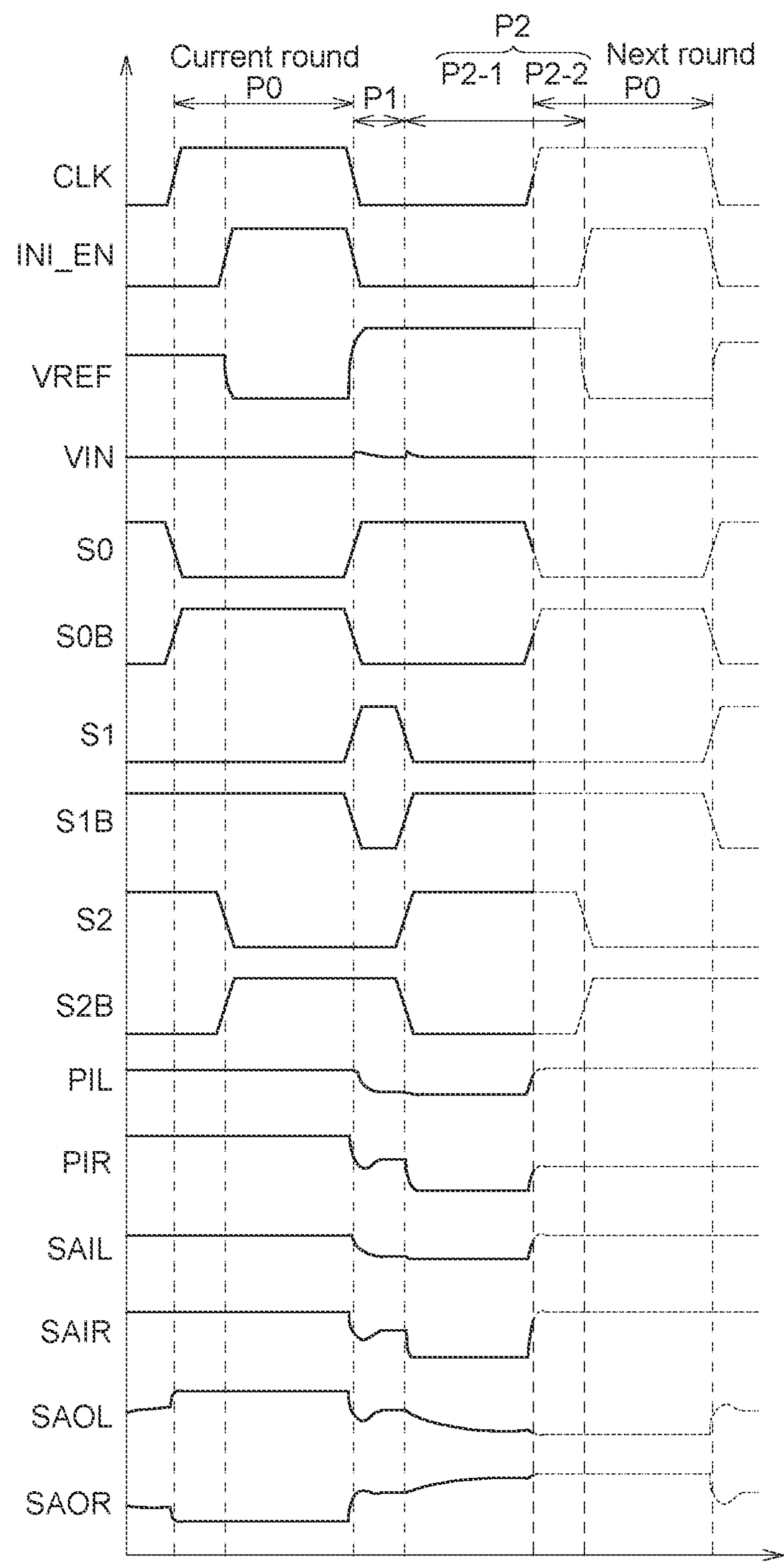
FIG. 4B shows waveforms of the sense amplifier in the first sub-phase of the third second phase according to one embodiment of the application.

FIG. 4B shows waveforms of the sense amplifier in the first sub-phase of the third second phase according to one embodiment of the application.

During the first sub-phase P2-1 of the third phase P2, the voltage difference between the input signal IN and the reference voltage VREF is amplified.

During the first sub-phase P2-1 of the third phase P2, the input signal IN keeps while the reference voltage VREF is logic high.

During the first sub-phase P2-1 of the third phase P2, the pass gates PG15 and PG16 are connected. Before the first sub-phase P2-1 of the third phase P2, levels of the first node PIL and the second PIR are transited as the transit point voltages VTPL and VTPR. During the first sub-phase P2-1 of the third phase P2, at the moment the pass gates PG15 and PG16 transit from disconnecting into connecting, the voltage difference (VIN-VTPR) between the input signal IN and the second node PIR (having a level of the transit point voltage VTPR) is coupled to the second sensing input voltage SAIR via the second capacitor CR to cause a voltage change of the second sensing input voltage SAIR; and the voltage difference (VREF-VTPL) between the reference voltage VREF and the first node PIL (having a level of the transit point voltage VTPL) is coupled to the first sensing input voltage SAIL via the first capacitor CL to cause a voltage change of the first sensing input voltage SAIL. Therefore, the first sensing input voltage SAIL and the second sensing input voltage SAIR both have voltage changes. Voltage changes of the first sensing input voltage SAIL and the second sensing input voltage SAIR reflect to the first sensing output voltage SAOL and the second sensing output voltage SAOR. That is, when the voltage changes of the first sensing input voltage SAIL and the second sensing input voltage SAIR are "+Δ", then the first sensing output voltage SAOL and the second sensing output voltage SAOR have the voltage changes as "−Δ".

Here, the case that the second sensing output voltage SAOR is higher than the first sensing output voltage SAOL is described. In this case, the second sensing output voltage SAOR gradually conducts the fifth transistor M5 while gradually disconnects the seventh transistor M7; and the first sensing output voltage SAOL gradually conducts the eighth transistor M8 while gradually disconnects the sixth transistor M6. By so, via positive feedback effect, the transistors M8 and M5 are gradually conducted while the transistors M6 and M7 are gradually disconnected.

Similarly, in the case that the second sensing output voltage SAOR is lower than the first sensing output voltage SAOL, the second sensing output voltage SAOR gradually conducts the seventh transistor M7 while gradually disconnects the fifth transistor M5; and the first sensing output voltage SAOL gradually conducts the sixth transistor M6 while gradually disconnects the eighth transistor M8. By so, via positive feedback effect, the transistors M6 and M7 are gradually conducted while the transistors M8 and M5 are gradually disconnected.

Thus, when the input signal IN is higher than the reference voltage VREF, (VTPL-VREF)>(VTPR-VIN). Via the positive feedback effect, the first sensing output voltage VSAOL is gradually lowered while the second sensing output voltage VSAOR is gradually increased. When the input signal IN is lower than the reference voltage VREF, (VTPL-VREF)<(VTPR-VIN). Via the positive feedback effect, the first sensing output voltage VSAOL is gradually increased while the second sensing output voltage VSAOR is gradually lowered.

Figure 5A:
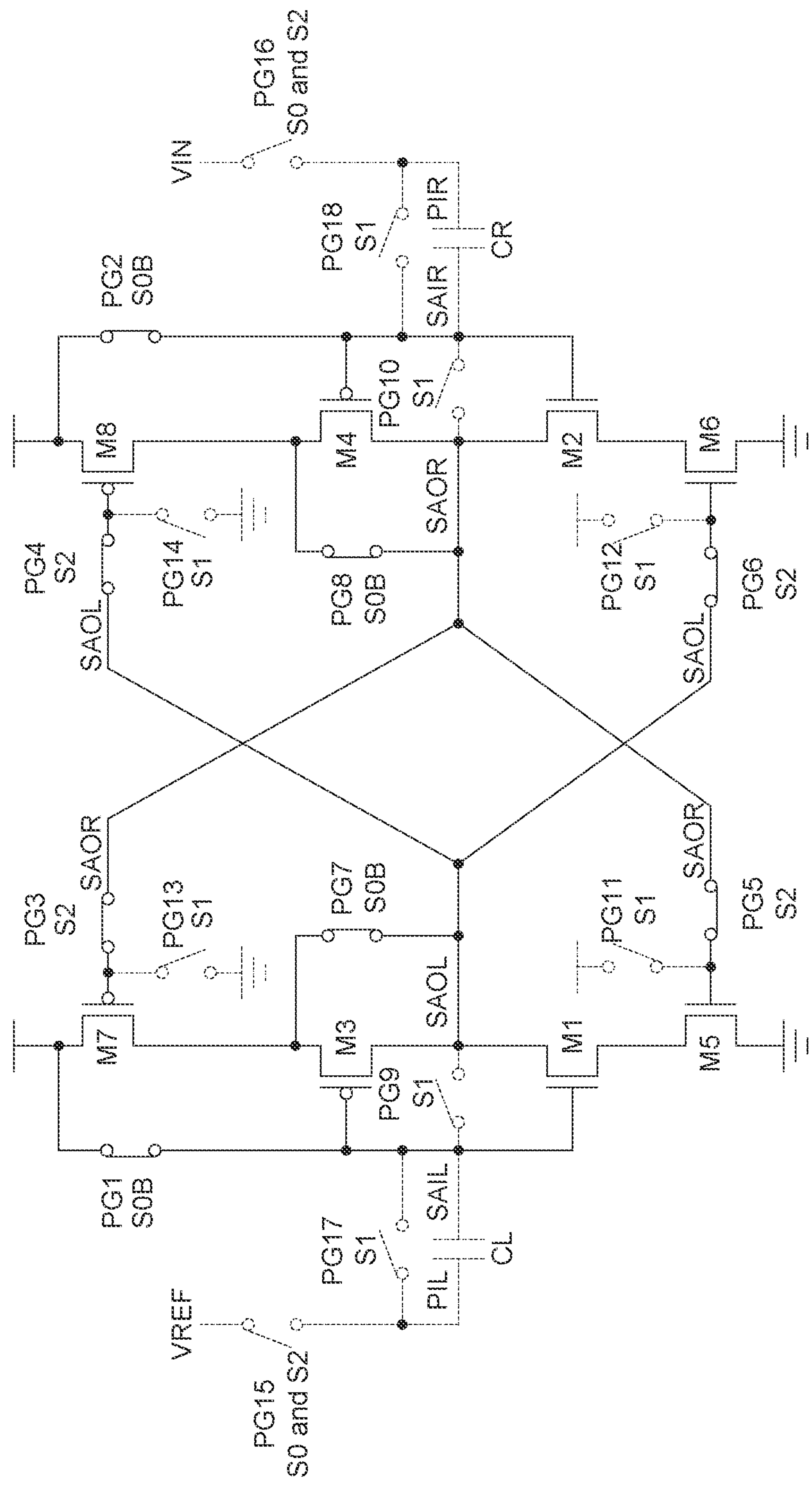
FIG. 5A shows operations of the sense amplifier in the second sub-phase of the third phase according to one embodiment of the application.
Figure 5B:
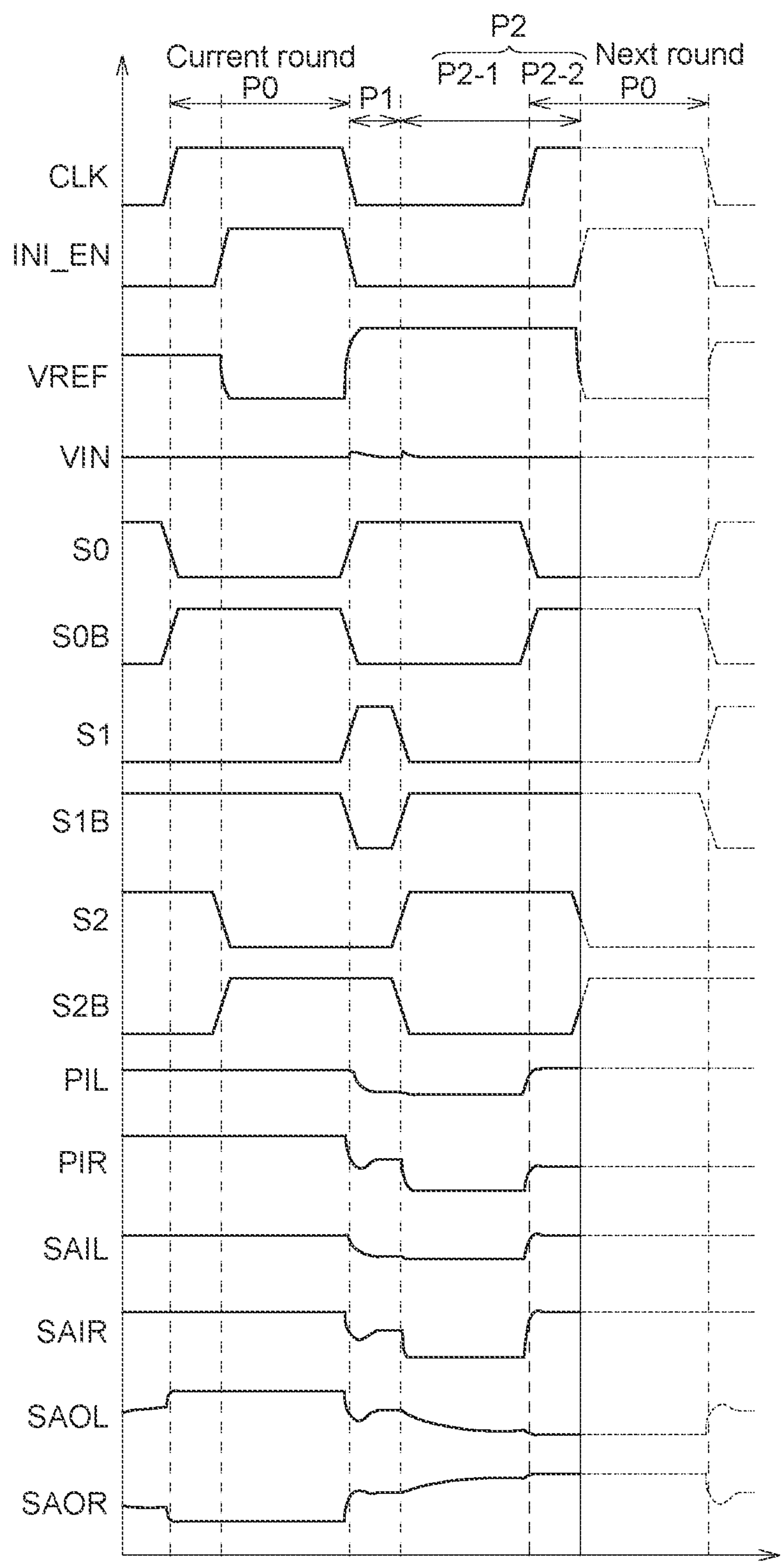
FIG. 5B shows waveforms of the sense amplifier in the second sub-phase of the third second phase according to one embodiment of the application.

FIG. 5A shows operations of the sense amplifier in the second sub-phase of the third phase according to one embodiment of the application. FIG. 5B shows waveforms of the sense amplifier in the second sub-phase of the third second phase according to one embodiment of the application.

During the second sub-phase P2-2 of the third phase P2, the first sensing output voltage SAOL and the second sensing output voltage SAOR are pulled to a full-swing voltage range and charges are recorded into gates of the transistors M5-M8.

During the second sub-phase P2-2 of the third phase P2, the first switch signal S0 transits to disconnect the pass gates PG15 and PG16 for blocking the path of the input signal. The pass gates PG1, PG2, PG3, PG4, PG5, PG6, PG7 and PG8 are connected.

Besides, because the pass gates PG3 and PG4 are connected, the amplification path during the first sub-phase of the third phase is broken. Further, the transistors M5 to M8 are connected, the transistors M1 and M2 are connected while the transistors M3 and M4 are disconnected. Thus, the transistors M5 to M8 form a latch unit. By so, the first sensing output voltage SAOL and the second sensing output voltage SAOR are pulled to the full-swing voltage range. That is, when the first sensing output voltage SAOL is higher than the second sensing output voltage SAOR, the first sensing output voltage SAOL and the second sensing output voltage SAOR are pulled to the operation voltage VDD and the ground VSS, respectively. When the first sensing output voltage SAOL is lower than the second sensing output voltage SAOR, the first sensing output voltage SAOL and the second sensing output voltage SAOR are pulled to the ground VSS and the operation voltage VDD, respectively.

Further, because the pass gates PG3, PG4, PG5 and PG6 are connected and charges are recorded into the gates of the transistors M5-M8.

Besides, if the first switch signal S0 is not transited, the first sensing output voltage SAOL and the second sensing output voltage SAOR are kept.

Figure 6A:
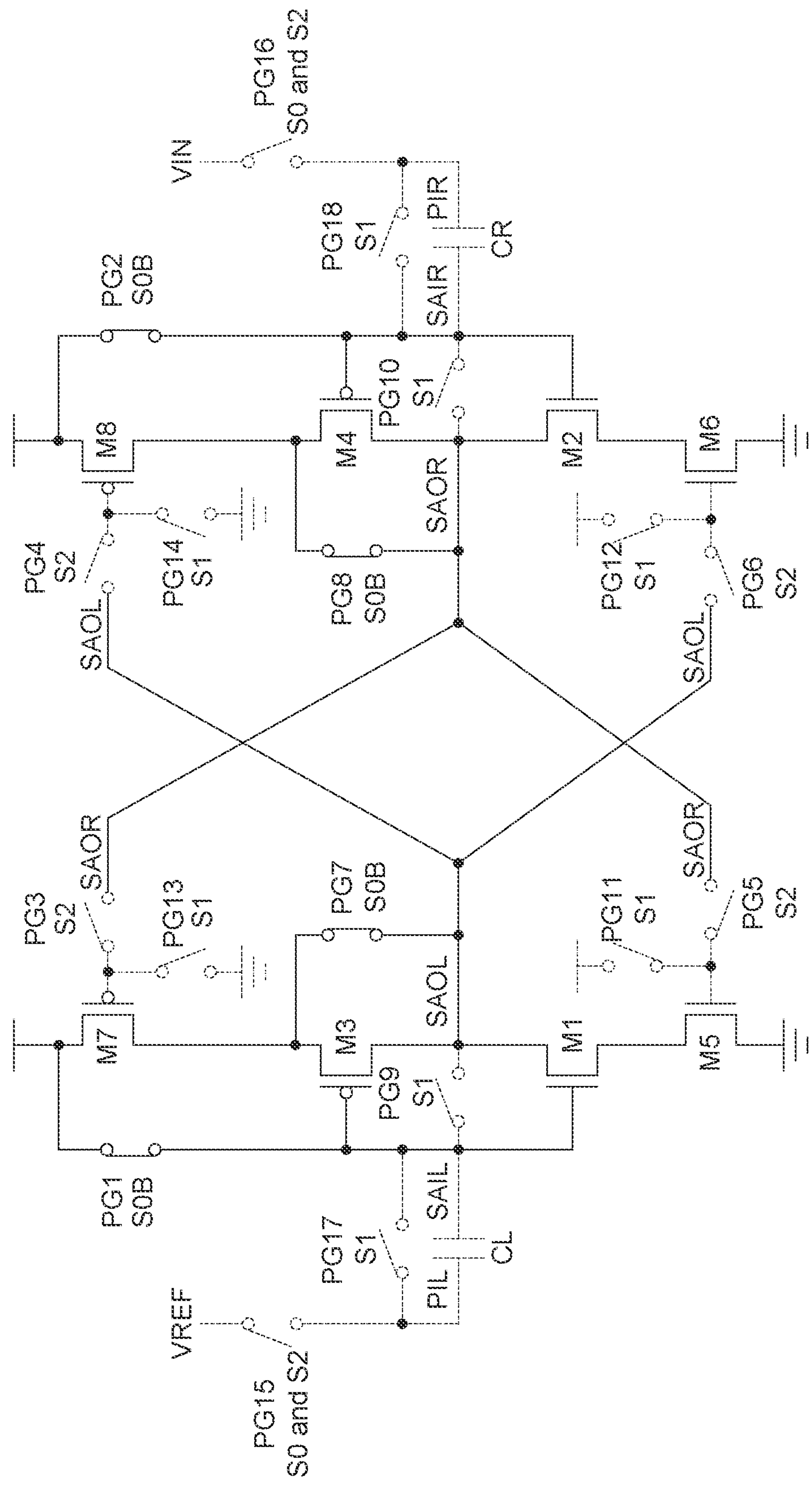
FIG. 6A shows the operations of the sense amplifier during the first phase of the next round according to one embodiment of the application.
Figure 6B:
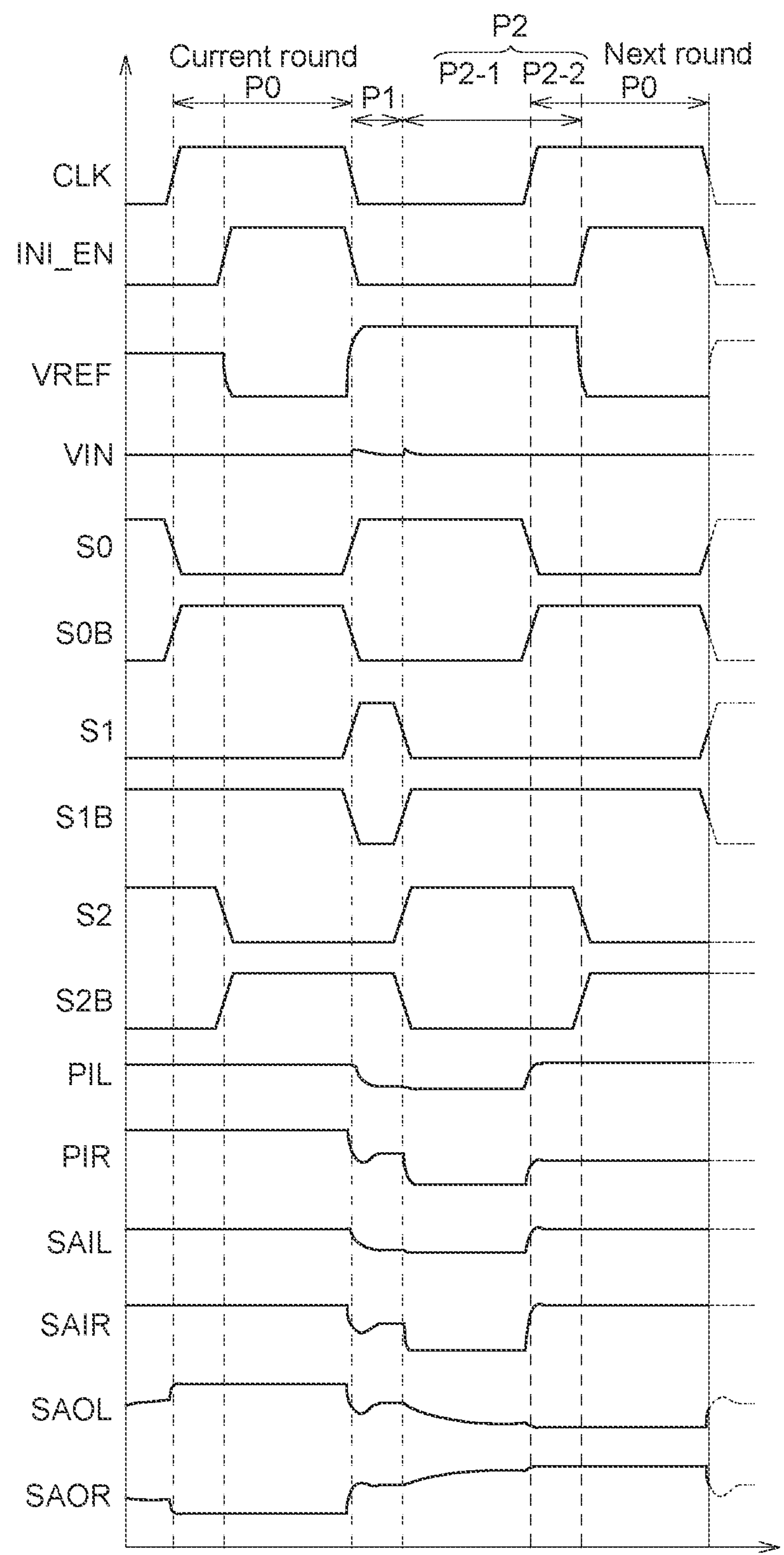
FIG. 6B shows the signal waveforms of the sense amplifier during the first phase of the next round according to one embodiment of the application.

FIG. 6A shows the operations of the sense amplifier during the first phase of the next round according to one embodiment of the application. FIG. 6B shows the signal waveforms of the sense amplifier during the first phase of the next round according to one embodiment of the application.

During the next round, the enable signal INI_EN is enabled again to start the first phase of the next round. As shown in FIG. 6B, the first phase PC of the next round is partially overlapped with the second sub-phase P2-2 of the third phase P2 of the current round.

FIG. 6A and FIG. 6B are similar to FIG. 2A and FIG. 2B and thus the details are omitted.

At the sensing operations of the next round, the pass gates PG3, PG4, PG5 and PG6 are disconnected.

Figure 7:
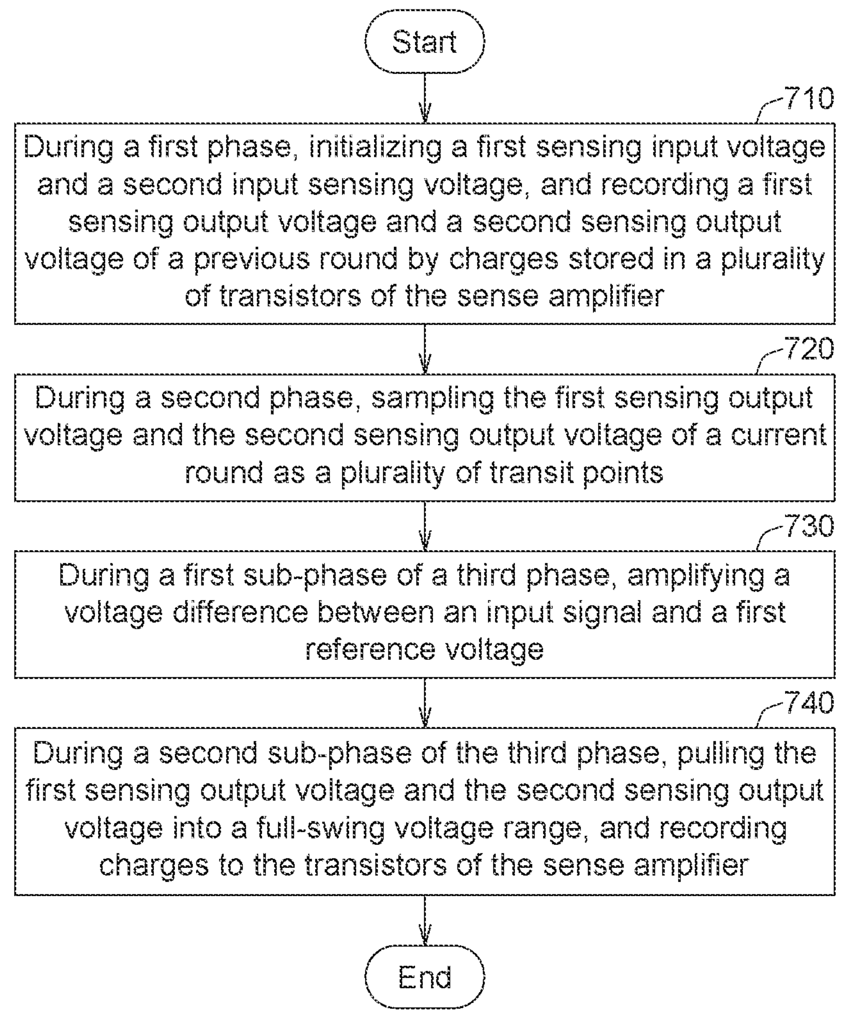
FIG. 7 shows an operation method for a sense amplifier according to one embodiment of the application.

FIG. 7 shows an operation method for a sense amplifier according to one embodiment of the application. The operation method for the sense amplifier includes: during a first phase, initializing a first sensing input voltage and a second input sensing voltage, and recording a first sensing output voltage and a second sensing output voltage of a previous round by charges stored in a plurality of transistors of the sense amplifier (710); during a second phase, sampling the first sensing output voltage and the second sensing output voltage of a current round as a plurality of transit points (720); during a first sub-phase of a third phase, amplifying a voltage difference between an input signal and a first reference voltage (730); and during a second sub-phase of the third phase, pulling the first sensing output voltage and the second sensing output voltage into a full-swing voltage range, and recording charges to the transistors of the sense amplifier (740).

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operation method for a sense amplifier, the operation method comprising:

during a first phase, initializing a first sensing input voltage and a second input sensing voltage; and recording a first sensing output voltage and a second sensing output voltage of a previous round by charges stored in a plurality of transistors of the sense amplifier;

during a second phase, sampling the first sensing output voltage and the second sensing output voltage of a current round as a plurality of transit points;

during a first sub-phase of a third phase, amplifying a voltage difference between an input signal and a first reference voltage; and during a second sub-phase of the third phase, pulling the first sensing output voltage and the second sensing output voltage into a full-swing voltage range, and recording charges to the transistors of the sense amplifier.

2. The operation method for the sense amplifier according to claim 1, wherein during the first phase, initializing the first sensing input voltage and the second input sensing voltage includes:

initializing the first sensing input voltage and the second input sensing voltage as a second reference voltage.

3. The operation method for the sense amplifier according to claim 1, wherein during the second phase, sampling the first sensing output voltage and the second sensing output voltage of the current round as the plurality of transit points includes:

sampling the first sensing output voltage and the second sensing output voltage as the respective transit points of a plurality of signal paths.

4. The operation method for the sense amplifier according to claim 3, wherein during the second phase, sampling the first sensing output voltage as a plurality of first threshold voltages of a plurality of transistors of a first signal path; and sampling the second sensing output voltage as a plurality of second threshold voltages of a plurality of transistors of a second signal path.

5. The operation method for the sense amplifier according to claim 1, wherein during the first sub-phase of the third phase, amplifying the voltage difference between the input signal and the first reference voltage includes:

a voltage difference between the first reference voltage and a first node is capacitively coupled to the first sensing input voltage to cause a first voltage change of the first sensing input voltage;

a voltage difference between the input signal and a second node is capacitively coupled to the second sensing input voltage to cause a second voltage change of the second sensing input voltage; and the first voltage change of the first sensing input voltage and the second voltage change of the second sensing input voltage reflect the first sensing output voltage and the second sensing output voltage.

6. The operation method for the sense amplifier according to claim 5, wherein during the first sub-phase of the third phase, when the input signal is higher than the first reference voltage, the first sensing output voltage is gradually lowered and the second sensing output voltage is gradually increased via a positive feedback effect; and when the input signal is lower than the first reference voltage, the first sensing output voltage is gradually increased and the second sensing output voltage is gradually lowered via the positive feedback effect.

7. The operation method for the sense amplifier according to claim 1, wherein during the second sub-phase of the third phase, pulling the first sensing output voltage and the second sensing output voltage into the full-swing voltage range includes:

when the first sensing output voltage is higher than the second sensing output voltage, pulling the first sensing output voltage and the second sensing output voltage to a second reference voltage and a third reference voltage, respectively; and when the first sensing output voltage is lower than the second sensing output voltage, pulling the first sensing output voltage and the second sensing output voltage to the third reference voltage and the second reference voltage, respectively.

8. The operation method for the sense amplifier according to claim 1, wherein during the first phase, recording the first sensing output voltage and the second sensing output voltage of the previous round by charges stored in a plurality of gates of the transistors of the sense amplifier; and during the second sub-phase of the third phase, recording charges to the respective gates of the transistors of the sense amplifier.

9. A sense amplifier comprising:

a plurality of transistors; and a plurality of pass gates coupled to the transistors, wherein during a first phase, initializing a first sensing input voltage and a second input sensing voltage; and recording a first sensing output voltage and a second sensing output voltage of a previous round by charges stored in the transistors;

during a second phase, sampling the first sensing output voltage and the second sensing output voltage of a current round as a plurality of transit points;

during a first sub-phase of a third phase, amplifying a voltage difference between an input signal and a first reference voltage; and during a second sub-phase of the third phase, pulling the first sensing output voltage and the second sensing output voltage into a full-swing voltage range, and recording charges to the transistors of the sense amplifier.

10. The sense amplifier according to claim 9, wherein during the first phase, the first sensing input voltage and the second input sensing voltage are initialized by: initializing the first sensing input voltage and the second input sensing voltage as a second reference voltage.

11. The sense amplifier according to claim 9, wherein during the second phase, the first sensing output voltage and the second sensing output voltage of the current round are sampled as the plurality of transit points by: sampling the first sensing output voltage and the second sensing output voltage as the respective transit points of a plurality of signal paths.

12. The sense amplifier according to claim 11, wherein during the second phase, sampling the first sensing output voltage as a plurality of first threshold voltages of a plurality of transistors of a first signal path; and sampling the second sensing output voltage as a plurality of second threshold voltages of a plurality of transistors of a second signal path.

13. The sense amplifier according to claim 9, wherein during the first sub-phase of the third phase, the voltage difference between the input signal and the first reference voltage is amplified by: capacitively coupling a voltage difference between the first reference voltage and a first node to the first sensing input voltage to cause a first voltage change of the first sensing input voltage; capacitively coupling a voltage difference between the input signal and a second node to the second sensing input voltage to cause a second voltage change of the second sensing input voltage; and reflecting the first sensing output voltage and the second sensing output voltage by the first voltage change of the first sensing input voltage and the second voltage change of the second sensing input voltage.

14. The sense amplifier according to claim 13, wherein during the first sub-phase of the third phase, when the input signal is higher than the first reference voltage, the first sensing output voltage is gradually lowered and the second sensing output voltage is gradually increased via a positive feedback effect; and when the input signal is lower than the first reference voltage, the first sensing output voltage is gradually increased and the second sensing output voltage is gradually lowered via the positive feedback effect.

15. The sense amplifier according to claim 9, wherein during the second sub-phase of the third phase, the first sensing output voltage and the second sensing output voltage are pulled into the full-swing voltage range by:

when the first sensing output voltage is higher than the second sensing output voltage, pulling the first sensing output voltage and the second sensing output voltage to a second reference voltage and a third reference voltage, respectively; and when the first sensing output voltage is lower than the second sensing output voltage, pulling the first sensing output voltage and the second sensing output voltage to the third reference voltage and the second reference voltage, respectively.

16. The sense amplifier according to claim 9, wherein during the first phase, the first sensing output voltage and the second sensing output voltage of the previous round are recorded by charges stored in a plurality of gates of the transistors of the sense amplifier; and during the second sub-phase of the third phase, charges are recorded to the respective gates of the transistors of the sense amplifier.

* * * * *